United States Patent
Ge et al.

(10) Patent No.: US 9,355,945 B1
(45) Date of Patent: May 31, 2016

(54) SEMICONDUCTOR DEVICE WITH HEAT-DISSIPATING LEAD FRAME

(71) Applicant: FREESCALE SEMICONDUCTOR, INC., Austin, TX (US)

(72) Inventors: You Ge, Tianjin (CN); Meng Kong Lye, Shah Alam (MY); Zhijie Wang, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/843,967

(22) Filed: Sep. 2, 2015

(51) Int. Cl.
 *H01L 23/495* (2006.01)
 *H01L 23/31* (2006.01)
 *H01L 21/48* (2006.01)
 *H01L 21/56* (2006.01)

(52) U.S. Cl.
 CPC ...... *H01L 23/49568* (2013.01); *H01L 21/4825* (2013.01); *H01L 21/4842* (2013.01); *H01L 21/565* (2013.01); *H01L 23/3114* (2013.01); *H01L 23/49503* (2013.01); *H01L 23/49541* (2013.01)

(58) Field of Classification Search
 CPC ............. H01L 23/49568; H01L 23/3114; H01L 23/49503; H01L 23/49541
 USPC ........................ 257/676, 666, 675
 See application file for complete search history.

(56) References Cited

U.S. PATENT DOCUMENTS

| | | | | |
|---|---|---|---|---|
| 3,930,114 A | 12/1975 | Hodge | | |
| 5,041,902 A | 8/1991 | McShane | | |
| 5,072,283 A | 12/1991 | Bolger | | |
| 5,554,886 A * | 9/1996 | Song | ........... | H01L 23/4951 257/666 |
| 5,594,234 A * | 1/1997 | Carter, Jr. | ......... | H01L 23/49503 257/666 |
| 5,821,615 A * | 10/1998 | Lee | ........... | H01L 23/3121 257/686 |
| 6,080,602 A * | 6/2000 | Tani | ........... | H01L 21/56 257/E21.502 |
| 6,084,310 A * | 7/2000 | Mizuno | ........... | H01L 21/565 257/692 |
| 6,281,568 B1 * | 8/2001 | Glenn | ........... | H01L 23/3107 257/666 |
| 6,603,196 B2 * | 8/2003 | Lee | ........... | H01L 23/3107 257/666 |
| 6,918,178 B2 | 7/2005 | Chao | | |
| 7,009,283 B1 | 3/2006 | de Simone | | |
| 7,968,998 B1 * | 6/2011 | Choi | ........... | H01L 23/49541 257/666 |
| 8,067,821 B1 * | 11/2011 | Choi | ........... | H01L 23/49551 257/666 |
| 8,211,753 B2 | 7/2012 | Ramakrishna | | |
| 8,901,722 B2 | 12/2014 | Ge et al. | | |
| 2010/0001384 A1 * | 1/2010 | Bathan | ........... | H01L 23/49503 257/676 |
| 2014/0103505 A1 * | 4/2014 | Zhao | ........... | H01L 23/4334 257/675 |

* cited by examiner

*Primary Examiner* — Nitin Parekh
(74) *Attorney, Agent, or Firm* — Charles E. Bergere

(57) ABSTRACT

A packaged semiconductor device has a top and a bottom and includes a lead frame, a die, and an encapsulant that encapsulates the die and most of the lead frame. The lead frame includes a die pad on which the die is mounted, leads electrically connected to the die such as with bond wires, and die pad extensions that fan out from the die pad. Each die-pad extension has a proximal segment and a distal segment. The distal segments are interleaved with the leads. The bottoms of the die pad and the proximal segments of the extensions may be exposed at the bottom of the device. The top of the device may have notches corresponding to the extensions and portions of the distal segments may be exposed and bent into corresponding ones of the notches at the top of the device.

10 Claims, 4 Drawing Sheets

400

SEMICONDUCTOR DEVICE WITH HEAT-DISSIPATING LEAD FRAME

BACKGROUND OF THE INVENTION

The present invention relates to integrated circuit (IC) packaging and, more specifically, to a semiconductor device with a heat-dissipating lead frame.

A lead frame is a collection of metal leads and possibly other elements (e.g., die paddle or flag and power bars) that is used in semiconductor packaging for assembling one or more IC dies into a single packaged semiconductor device. Prior to assembly into a packaged device, a lead frame may have support structures (e.g., a rectangular metal frame) that keep those elements in place. During the assembly process, the support structures may be wholly or partially removed. As used herein, the term "lead frame" may be used to refer to the collection of elements before assembly or after assembly, regardless of the presence or absence of those support structures.

FIG. 1A is a plan view of a conventional lead frame 100. FIG. 1B is a cross-sectional view of the lead frame 100 of FIG. 1A along cut line Y-Y. The lead frame 100 is a patterned sheet metal cut-out that includes a die pad or flag 101 and lead fingers 102(1)-102(44) that surround the die pad 101. The lead frame 100 may be used in IC packages such as quad flat packages (QFP). The die pad 101 is used for the mounting of at lease one IC die (not shown) during assembly, where the die is attached to the die pad 101 by, for example, an adhesive (not shown). The lead fingers 102, which will be transformed into corresponding leads during assembly, are for providing electrical connections between device-internal components of the die and device-external components.

The lead frame 100 has eleven lead fingers 102 per side. The lead fingers 102(11*(i−1)+1)-102(11*i) are supported by a corresponding dam bar 103(i), where i is an integer from one to four, inclusive. For example, the lead fingers 102(1)-102(11) are supported by the dam bar 103(1), and the lead fingers 102(12)-102(22) are supported by the dam bar 103(2). More generally, the relationship for a QFP can be described as dam bar number i supporting lead finger numbers N*(i−1)+1 to N*i, where N is the number of lead fingers per side. The dam bars 103 form a rectangle that is supported at its corners by corresponding tie bars 104(1)-104(4), which hold the dam bars 103 and lead fingers 102 in place relative to the die pad 101. Each tie bar 104 has a corresponding tie-bar down-set 105, which comprises two bends that allow the die pad 101 to be on a first plane and the lead fingers 102 to be on a second plane that is parallel to and at a different elevation than the first plane, as can be seen in FIG. 1B.

During assembly, a die (not shown) is mounted on the die pad 101 and then electrically connected to the lead fingers 102 with, for example, bond wires as is known in the art.

Following wire bonding, the assembly comprising the die, the lead frame 100, and the bond wires is mostly encapsulated in an encapsulant such as a molding compound, leaving the distal ends of the lead fingers 102 exposed. In some packages, the bottom of the die pad 101 is also left exposed, which allows for more-efficient dissipation of heat from the die.

In a typical assembly process, the lead frame 100 is just one lead frame in a one- or two-dimensional array of lead frames, where two adjacent lead frames in the array may share additional support structures (not shown). After encapsulation, the assembly is singulated into individual IC devices by sawing or laser cutting, which also removes the additional support structures, if any, and cuts the inter-lead segments of dam bars 103 to electrically isolate the lead fingers 102 from each other and from the tie bars 104. The lead fingers 102 of each IC device may also be trimmed and formed into shapes, such as so-called gull wings or j-leads, to form the leads of the packaged semiconductor device that is then ready for mounting on a printed circuit board (PCB). The bottom of the die pad 101 may be left exposed, or may be mounted on a heat sink or onto heat-conducting elements on the PCB.

As integrated circuits are becoming more complex and including more transistors, they are generating more heat. Accordingly, it would be advantageous to have a lead frame for a semiconductor device package that is good at dissipating such heat.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment of the invention, the lead frame includes die pad extensions that fan out from the die pad. The extensions both expand the thermo-conductive area of the bottom of the corresponding package and, with sufficiently long extensions and appropriate assembly, allow for heat dissipation from the sides and top of the package.

Figure 1A:
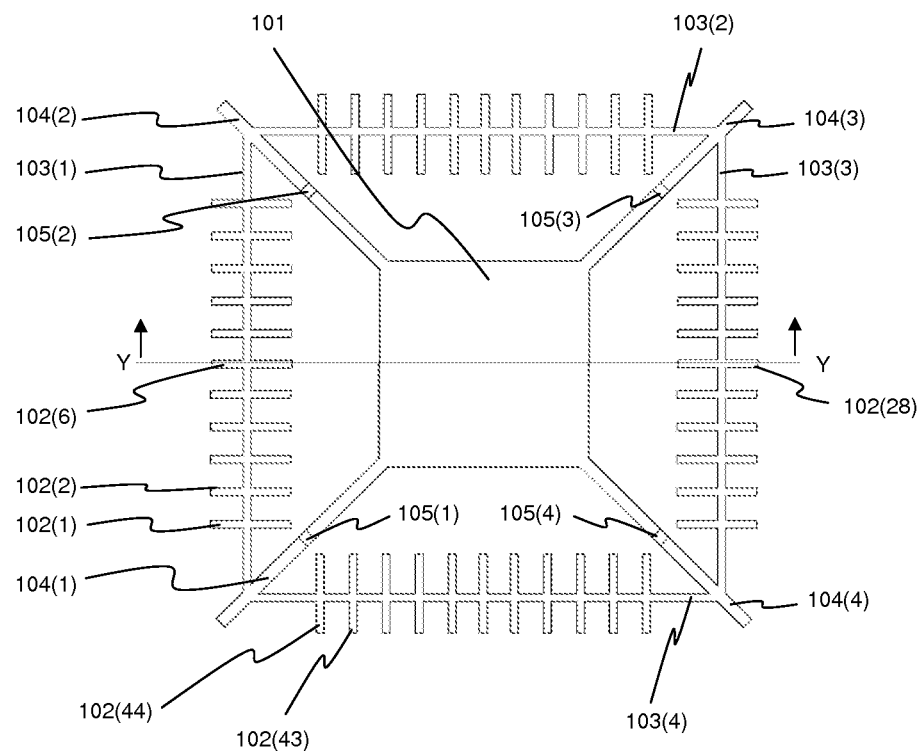
FIG. 1A is a plan view of a conventional lead frame.
Figure 1B:
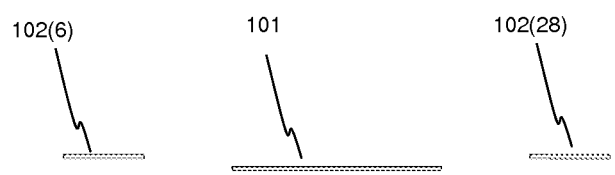
FIG. 1B is a cross-sectional view of the lead frame of FIG. 1A.
Figure 2A:
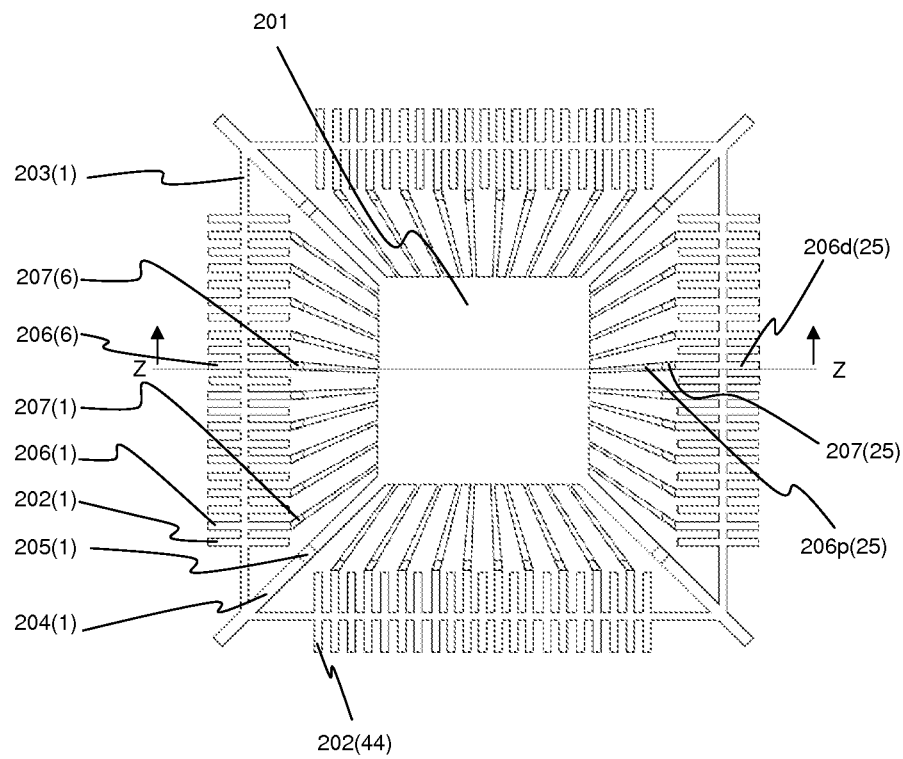
FIG. 2A is a plan view of a lead frame in accordance with one embodiment of the present invention.
Figure 2B:
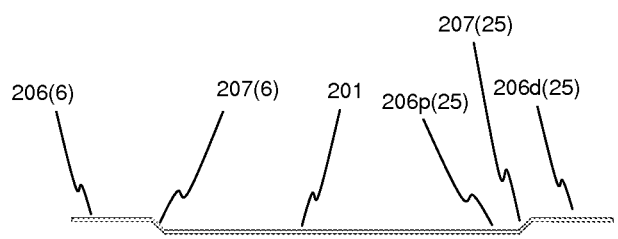
FIG. 2B is a cross-sectional view of the lead frame of FIG. 2A.

Referring now to FIG. 2A, a plan view of an exemplary lead frame 200 in accordance with one embodiment of the present invention is shown. FIG. 2B is a cross-sectional view of the lead frame 200 of FIG. 2A along cut line Z-Z. Elements of the lead frame 200 that are substantially similar to corresponding elements of the lead frame 100 of FIGS. 1A-1B are similarly labeled, but with a different prefix.

The lead frame 200 includes a die pad 201, a plurality of lead fingers 202 (in this example, the lead frame has 44 lead fingers) that surround the die pad 201, four dam bars 203, four tie bars 204, and four tie bar down-sets 205. These elements are substantially the same as the corresponding elements of the lead frame 100. The lead frame 200 further includes a plurality of die pad extensions 206 (in this example there are forty (40)) that fan out from the die pad 201 and extend to the outer edges of the lead frame 200.

In the embodiment shown, the lead frame 200 has ten (10) die pad extensions 206 per side. The extensions 206(10*(i−1)+1)-206(10*i), as well as lead fingers 202(11(i−1)+1)-202(11*i), are supported by a corresponding dam bar 203(i), where i is an integer from one to four, inclusive. For example, the die pad extensions 206(1)-206(10) and the lead fingers 202(1)-202(11) are supported by the dam bar 203(1), and the extensions 206(11)-206(20) and the lead fingers 202(12)-202(22) are supported by the dam bar 203(2). More generally, the relationship for a QFP can be described as dam bar number i supporting the die pad extensions numbered $N*(i-1)+1$ to $N*i$, where N is the number of extensions per side, and the lead fingers numbered $M*(i-1)+1$ to $M*i$, where M is the number of lead fingers per side. Along each dam bar 203, the lead fingers 202 alternate with the extensions 206, forming an interleaved pattern along the dam bar 203. The distal ends of the die pad extensions 206 extend out from the corresponding dam bar to the same extent as the distal ends of the lead fingers 202.

The die pad extensions 206 have corresponding proximal segments 206p and connected distal segments 206d. Each proximal extension segment 206p fans out from the die pad 201 and may widen as it extends away from the die pad 201. Each distal extension segment 206d is substantially parallel with the adjacent lead fingers 202 on their supporting dam bar 203. Somewhere along each die pad extension 206 is a corresponding extension down-set 207, which, in this embodiment, is located at the end of the proximal segment 206p connected to the distal segment 206d. Note that, in other embodiments, the extension down-set 207 may be located at other sections of the proximal extension segment 206p and/or the distal extension segment 206d. The extension down-sets 207, like the tie bar down-sets 205, allow (i) at least part of the proximal extension segments 206p to lie on a first plane with the die pad 201 and (ii) at least part of the distal extension segments 206d to lie on a second, different plane with the lead fingers 202.

Figure 3:
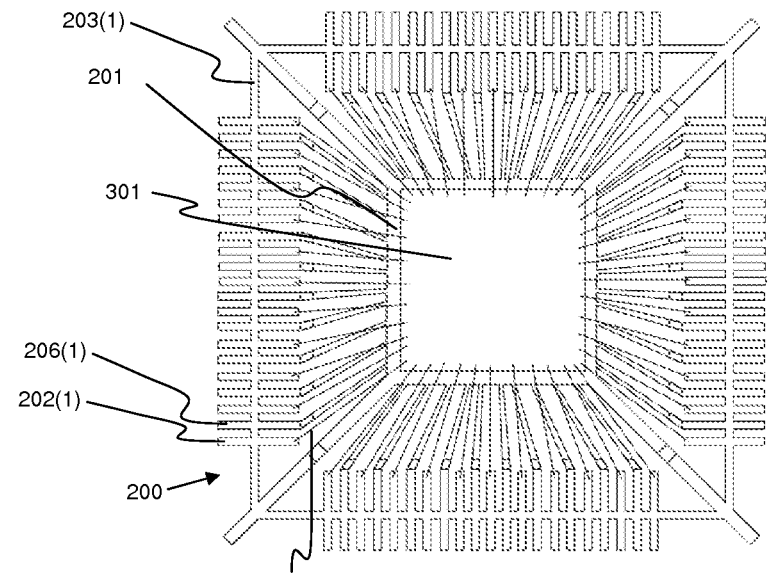
FIG. 3 is a plan view of an assembly that includes the lead frame of FIGS. 2A and 2B after the mounting of a die on the die pad and the wire bonding of the die to the lead fingers.

FIG. 3 is a plan view of an assembly 300, which comprises the lead frame 200 of FIGS. 2A and 2B after the mounting of a die 301 on the die pad 201 and the electrically connecting of the die 301 to the lead fingers 202 with bond wires 302. Each bond wire 302 connects a bond pad (not shown) on the die 301 to a corresponding lead finger 202. For example, the bond wire 302(1) electrically connects a bond pad on the die 301 to the lead finger 202(1).

Figure 4:
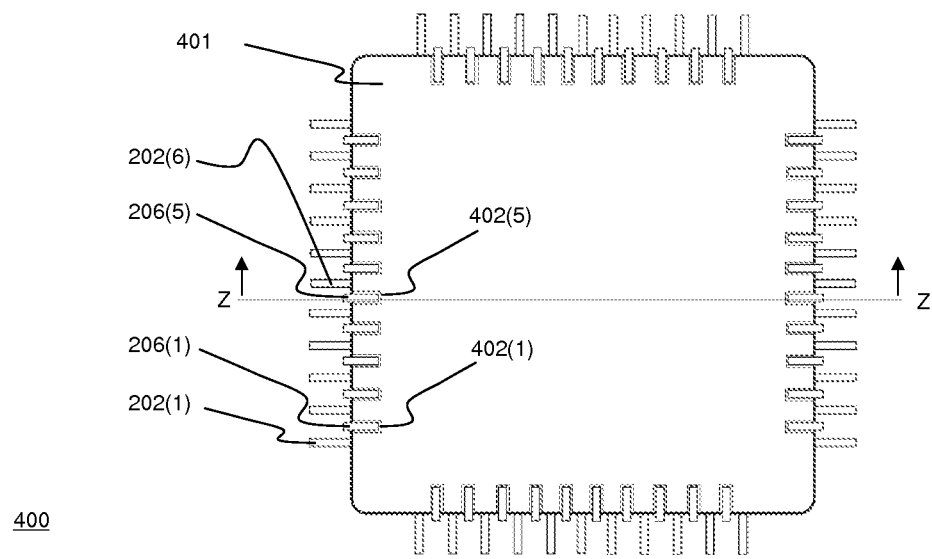
FIG. 4 is a plan view of a packaged device corresponding to the assemblage of FIG. 3 after encapsulation, singulation, and lead trimming and forming.

FIG. 4 is a plan view of a packaged semiconductor device 400 corresponding to the assembly 300 of FIG. 3 after encapsulation, singulation, and trimming and forming of the lead fingers 202. The assembly 300 has been encapsulated with an encapsulant 401, and the dam bars 203 have been removed.

Figure 6:
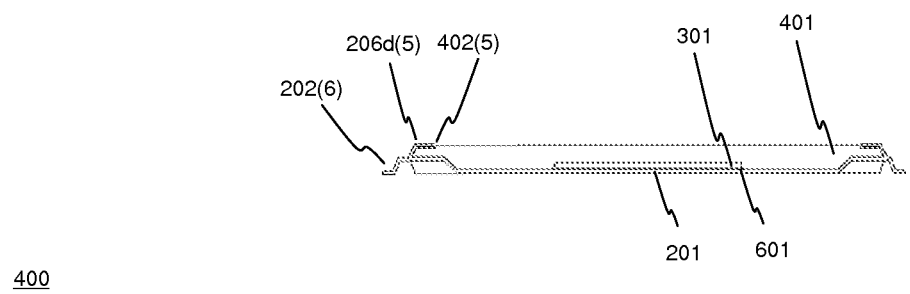
FIG. 6 is a cut-away side view of the packaged device of FIG. 4 along cut line Z-Z, after additional forming.

FIG. 6 is a cut-away side view of the packaged device 400 of FIG. 4 along the cut line Z-Z. The lead fingers 202 have been bent into gull-wing shapes for attachment to a corresponding printed circuit board (PCB) (not shown). As can be seen, the die 301 is attached to the die pad 201 with a die attach adhesive 601.

The top of the packaged device 400 has channel-like notches 402 in the encapsulant 401 that correspond to the die pad extensions 206. The exposed portions of the die pad extensions 206, which extend out from the packaged device 400 after encapsulation, have been bent up and into the corresponding notches 402. In particular, the distal segments 206d, such as the distal segment 206d(5), of the extensions 206 are bent up and into corresponding ones of the notches 402, such as the notch 402(5). The bent extensions 206 allow for the dissipation of heat generated by the encapsulated die 301 from the sides and top of the packaged device 400, in addition to dissipation from the bottom of the packaged device 400. One way of embedding the extensions 206 in the notches 402 is to first form the notches 402 (during molding) and then bend the extensions 206 into the notches 402. Alternatively, the extensions 206 could be bent into position prior to molding and then the notches 402 formed around the extensions 206, in which case some additional finishing steps like grinding may be necessary to expose the extensions 206 to improve their heat dissipating ability.

Figure 5:
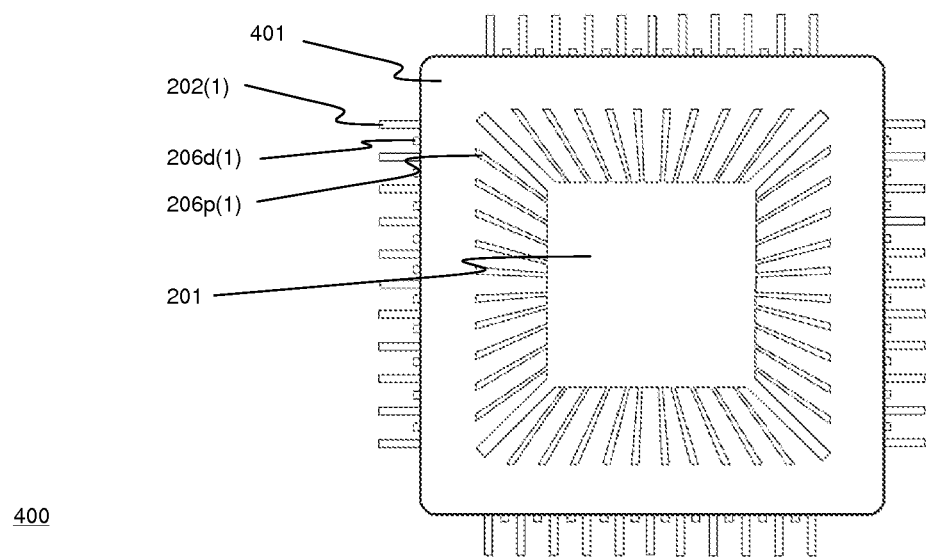
FIG. 5 is a bottom view of the packaged device of FIG. 4.

FIG. 5 is a bottom view of the packaged device 400 of FIG. 4. The bottom of the die pad 201 is exposed, as are portions of the proximal segments 206p of the die pad extensions 206. The exposed portions of the die pad extensions 206 help increase the dissipation of heat from the die 301 through the bottom of the device 400 than would be achievable by only the die pad 201.

Embodiments of the invention have been described where the top of the packaged device has notches corresponding to the die pad extensions. The invention, however, is not so limited. In some alternative embodiments, the packaged device does not have any notches at the top for receiving the die pad extensions. In some implementations, the die pad extensions are bent over the notch-less top of the packaged device. In some implementations, the die pad extensions are not bent up and over the top of the packaged device. In some implementations, the die pad extensions do not extend out from the packaged device.

Embodiments of the invention have been described where the lead frames are for four-sided packaged devices such as QFP devices. The invention, however, is not limited to packaged devices with leads on four sides. In some alternative embodiments, the lead frames may be for packaged devices with leads on two sides, such as small-outline integrated circuit (SOIC) devices, with corresponding modifications, as would be appreciated by a person of ordinary skill in the art.

Embodiments of the invention have been described with exemplary numbers and shapes of lead fingers and die pad extensions. The invention, however, is not so limited. In alternative embodiments, the lead frames have different numbers of lead fingers and/or die pad extensions formed into the same or different shapes.

Embodiments of the invention have been described where a die is electrically connected to the lead fingers by wire bonding. The invention, however, is not so limited. The die may be electrically connected to the lead fingers using any suitable technology.

Embodiments of the invention have been described where, after trimming, the distal ends of the die pad extensions extend out from the packaged device the same distance as the adjacent leads. The invention is not, however, so limited. In some alternative embodiments, one or more of the die pad extensions extend farther from the packaged device than the adjacent leads. In some alternative embodiments, one or more of the die pad extensions terminate closer to the packaged device than the adjacent leads. In some alternative embodiments, the die pad extensions do not reach the dam bars and terminate before reaching the dam bars. Consequently, in these embodiments, the distal segments of the die pad extensions are not exposed and do not extend out from the packaged device. In some embodiments, the die pad extensions do not include extension down-sets.

Embodiments of the invention have been described where the die pad extensions are interleaved with the lead fingers of each dam bar of the lead frame, where, on each side of the die, no two die pad extensions are adjacent to one another, and no two lead fingers are adjacent to one another. The invention, however, is not so limited. In alternative embodiments, the number and pattern of the fan-out die pad extensions may have a different relation to nearby lead fingers. In some alternative embodiments, the relation between the die pad extensions and the lead fingers may be irregular.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence. The Abstract included with this application is provided with the understanding that it will not be used for claim construction.

The invention claimed is:

1. An apparatus comprising a lead frame for a packaged semiconductor device, the lead frame comprising:
   a die pad;
   a plurality of lead fingers; and
   a plurality of die pad extensions fanning out from one or more sides of the die pad, wherein:
      each die pad extension comprises a proximal extension segment and a connected distal extension segment;
      the proximal extension segment fans out from the die pad; and
      the distal extension segment is substantially parallel with adjacent lead fingers, and the apparatus further comprising:
   a die attached to the die pad and electrically connected to the lead fingers; and
   an encapsulant that covers the die and at least some of the lead frame, wherein:
      a bottom surface of the die pad is exposed through a bottom surface of the encapsulant;
      the distal extension segment of each of the die pad extensions is exposed; and
      a top surface of the encapsulant includes notches that receive the exposed distal extension segments.

2. The apparatus of claim 1, wherein the lead frame further comprises one or more dam bars connected to hold the lead fingers in place relative to the die pad, wherein each dam bar supports a corresponding subset of the plurality of lead fingers.

3. The apparatus of claim 2, wherein:
   the set of connected dam bars comprises four dam bars arranged to form a rectangular frame; and
   further comprising four tie bars, each tie bar connecting a corner of the die pad to a corresponding corner of the rectangular frame.

4. The apparatus of claim 3, wherein each die pad extension of a subset of the plurality of die pad extensions terminates inside the rectangular frame without contacting a dam bar.

5. The apparatus of claim 2, wherein each dam bar supports a corresponding subset of the plurality of die pad extensions.

6. The apparatus of claim 1, wherein:
   the die pad is located on a first plane;
   the lead fingers are located on a second plane that is parallel to the first plane and at a different elevation from the first plane; and
   each die pad extension includes an extension down-set located along the die pad extension such that a first segment of the die pad extension is located on the first plane and a second segment of the die pad extension is located on the second plane.

7. The apparatus of claim 1, wherein the proximal extension segment widens as it extends away from the die pad.

8. The apparatus of claim 1, wherein at least a portion of each distal extension segment of each die pad extension extends out from the encapsulant.

9. The apparatus of claim 1, wherein, the die pad extensions are interleaved with the lead fingers.

10. An integrated circuit device, comprising:
    a lead frame including a die pad, a plurality of leads that surround the die pad and are electrically isolated from the die pad, and a plurality of die pad extensions that fan out from one or more sides of the die pad;

a semiconductor die attached to the die pad and electrically connected to the leads; and an encapsulant encapsulating the die and at least an encapsulated segment of each of the pluralities of leads and die pad extensions, wherein:

each of the leads includes an exposed segment;

each of the die pad extensions includes an exposed segment that is bent up and over a top surface of the encapsulant;

the encapsulant includes notches in the top surface and each exposed segment of each of the die pad extensions is disposed within a corresponding notch in the top surface of the encapsulant; and the die pad is exposed through a bottom surface of the encapsulant.

* * * * *